(12) United States Patent
Lauronen et al.

(10) Patent No.: US 12,372,564 B2
(45) Date of Patent: Jul. 29, 2025

(54) GENERATING A MULTI-DIMENSIONAL MODEL OF A PHYSICAL ENVIRONMENT FOR MAPPING RADIO FREQUENCY MEASUREMENTS

(71) Applicant: Ekahau Inc., New York, NY (US)

(72) Inventors: Mikko Lauronen, Helsinki (FI); Jarno Kinnunen, Porvoo (FI); Miika Siren, Vantaa (FI)

(73) Assignee: Ekahau Inc., New York, NY (US)

( * ) Notice: Subject to any disclaimer, the term of this patent is extended or adjusted under 35 U.S.C. 154(b) by 0 days.

(21) Appl. No.: 18/409,376

(22) Filed: Jan. 10, 2024

(65) Prior Publication Data

US 2025/0076357 A1 Mar. 6, 2025

Related U.S. Application Data

(60) Provisional application No. 63/579,759, filed on Aug. 30, 2023.

(51) Int. Cl.
*G01R 29/00* (2006.01)
*G01R 29/10* (2006.01)
(Continued)

(52) U.S. Cl.
CPC ............ *G01R 29/10* (2013.01); *H04W 16/18* (2013.01); *H04W 16/20* (2013.01)

(58) Field of Classification Search
CPC ....... G01R 29/10; H04W 16/18; H04W 16/20
See application file for complete search history.

(56) References Cited

U.S. PATENT DOCUMENTS

2004/0236547 A1* 11/2004 Rappaport .............. H04L 41/22
  703/2
2006/0019679 A1* 1/2006 Rappaport .......... G01S 5/02521
  455/456.1
(Continued)

FOREIGN PATENT DOCUMENTS

AU  2020100529 A4  5/2020
CA  3188665 A1 *  3/2024  ........... G06F 16/587
(Continued)

OTHER PUBLICATIONS

Extended European Search Report and Search Opinion received for EP Application No. 24153404.9, mailed on Jul. 1, 2024, 8 pages.
(Continued)

*Primary Examiner* — Khai M Nguyen
(74) *Attorney, Agent, or Firm* — Aikin & Gallant, LLP (57) ABSTRACT

A device can detect radio frequency (RF) signals in a physical environment using one or more antennas of a device. The device can generate RF measurements based on the RF signals. The device can also generate a multi-dimensional model of the physical environment based on sensor information from one or more sensors of the device. For example, the multi-dimensional model could be a 2D or 3D floor plan of the physical environment. The device can then map the RF measurements to locations in the multi-dimensional model. In some implementations, the device can configure a graphical user interface to display the multi-dimensional model and the mapping. For example, the display could represent a heat map for determining a change to a network. Other aspects are also described and claimed.

20 Claims, 6 Drawing Sheets

(51) Int. Cl.
   *H04W 16/18*   (2009.01)
   *H04W 16/20*   (2009.01)

(56) References Cited

U.S. PATENT DOCUMENTS

| | | |
|---|---|---|
| 2015/0312774 A1 | 10/2015 | Lau |
| 2016/0277901 A1 | 9/2016 | Mitchell et al. |
| 2020/0226892 A1* | 7/2020 | Coles ........................ G08B 5/38 |
| 2021/0042354 A1* | 2/2021 | Paul ........................ G06F 16/29 |
| 2021/0274358 A1* | 9/2021 | Shankar .............. H04W 64/003 |
| 2022/0066023 A1 | 3/2022 | Hunt et al. |
| 2022/0108532 A1* | 4/2022 | Denneler ............... H04W 4/029 |
| 2023/0027175 A1* | 1/2023 | Valenza ................... G06T 15/06 |
| 2023/0061468 A1 | 3/2023 | Koltsov et al. |
| 2023/0345257 A1* | 10/2023 | Bourgeois ............. H04W 24/08 |
| 2024/0022919 A1* | 1/2024 | Valenza .............. H04W 16/225 |
| 2024/0107332 A1 | 3/2024 | Pulkkinen |
| 2024/0388924 A1 | 11/2024 | Marinescu-Gava et al. |

FOREIGN PATENT DOCUMENTS

| | | | | |
|---|---|---|---|---|
| EP | 3952439 A1 * | 2/2022 | ........ | H04W 36/0083 |
| WO | 2023242477 A1 | 12/2023 | | |
| WO | 2024008995 A1 | 1/2024 | | |
| WO | 2024023393 A1 | 2/2024 | | |
| WO | 2024023394 A1 | 2/2024 | | |

OTHER PUBLICATIONS

Office Action received for Finland Patent Application No. 20245064, mailed on Apr. 23, 2018, 8 pages.

\* cited by examiner

GENERATING A MULTI-DIMENSIONAL MODEL OF A PHYSICAL ENVIRONMENT FOR MAPPING RADIO FREQUENCY MEASUREMENTS

CROSS-REFERENCE TO RELATED APPLICATION

This application claims priority to U.S. Provisional Patent Application No. 63/579,759, filed Aug. 30, 2023, which is hereby incorporated by reference in its entirety.

TECHNICAL FIELD

This disclosure relates generally to wireless networks and, more specifically, to generating a multi-dimensional model of a physical environment for mapping radio frequency measurements associated with a wireless network. Other aspects are also described.

BACKGROUND

A wireless digital communications network (wireless network) may include computing devices or nodes that communicate with each other using wireless data connections. Each node may have a radio transmitter and/or a radio receiver that communicates with the network over radio frequencies (RF). A wireless local area network (WLAN) links two or more devices through an access point (AP). The AP typically connects to a wired router, a switch, or a hub via an Ethernet cable to obtain access to the Internet. The AP projects a wireless signal (e.g., a Wi-Fi signal) which other nodes that are nearby receive, to communicate with the AP and thereby also give those nodes access to the Internet. A typical wireless network may include one or more APs that provide RF coverage to the nodes of the network over a given region. A multi-band AP has multiple radios, operating in different frequency bands.

A network planning tool is used to assist an owner or administrator of the wireless network to design the network, by for example physically locating the APs in a facility (a given space) and configuring communication settings used by nodes of the wireless network. The network planning tool may obtain measurements made by a separate measurement tool. These are measurements of signals used for wireless communications in the network (RF measurements), and such measurements are then analyzed by the network planning tool to determine whether coverage is sufficient at various locations of the facility in which the wireless network is to be deployed. The network planning tool may help the user determine the number of APs as well as the physical locations of the APs to set the number of APs and their physical area of coverage. The user may, for example, wish to have as few APs as possible while providing a sufficiently large area of coverage.

SUMMARY

Implementations of this disclosure include a device that may utilize a combination of sensors, antennas, and software to generate a multi-dimensional model of a physical environment while obtaining RF measurements in the environment. This may enable surveying a wireless network, deployed in the environment, without previously obtaining a floor plan. Some implementations may include a device to detect RF signals in a physical environment using one or more antennas. The device can generate RF measurements based on the RF signals. The device can also generate a multi-dimensional model of the physical environment based on sensor information from one or more sensors of the device. For example, the multi-dimensional model could be a 2D or 3D floor plan of the physical environment. The device can then map the RF measurements to locations in the multi-dimensional model. In some implementations, the device can configure a graphical user interface (GUI) to display the multi-dimensional model and the mapping. For example, the display could represent a heat map for determining a change to a network. Other aspects are also described and claimed.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the Claims section. Such combinations may have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

When surveying a wireless network, a network planning tool may be used for mapping RF measurements (from a measurement tool) to various physical locations in a physical environment. Mapping the measurements to the locations may enable an assessment of the wireless network, such as whether signal strengths in certain areas are weak and should be improved. Such surveys may be performed for wireless networks in many different types of environments, such as office buildings, schools, hospitals, houses, and so forth.

To map measurements to locations in an environment, a floor plan of the environment is first obtained. For example, the floor plan could be a digital representation (e.g., a bitmap or JPEG file) of a drawing to scale showing a plan view of relationships between walls, rooms, spaces, traffic patterns, and other physical features at one level of a structure. Then, as measurements are taken, indications of locations in the floor plan corresponding to those measurements may be recorded (e.g., a particular signal strength occurring at a Cartesian X-Y coordinate in the floor plan). In some cases, a floor plan of an environment may not be available. In those cases, the floor plan is typically created by a user surveying the environment, measuring various walls, rooms, spaces, and other physical features, and utilizing computer-aided design (CAD) software to build the digital representation. However, this may be time consuming and labor intensive to accomplish.

Implementations of this disclosure address problems such as these by utilizing a combination of sensors, antennas, and software of a device to generate a multi-dimensional model of a physical environment while obtaining RF measurements in the environment. This may enable surveying a wireless network, deployed in the environment, without previously obtaining a floor plan of the environment. Some implementations may include a device configured to detect RF signals in a physical environment using one or more antennas. The device can generate RF measurements based on the RF signals. The device can also generate a multi-dimensional model of the physical environment based on sensor information from one or more sensors of the device. For example, the multi-dimensional model could be a 2D or 3D floor plan of the physical environment. The device can then map the RF measurements to locations in the multi-dimensional model. In some implementations, the device can configure a GUI to display the multi-dimensional model and the mapping. For example, the display could represent a heat map for determining a change to a network. As a result, a network surveyor could simply walk in the physical environment with the device and map measurements to locations by generating a multi-dimensional model comprising the floor plan while walking.

In some implementations, the device may include one or more sensors, such as one or more cameras, light detection and ranging (LIDAR) systems, and/or gyroscopes, which enable analyzing a surrounding environment of objects that may affect RF measurements, including walls, windows, doors, floors, ceilings, furniture, machines, people, and other visible structures. This may enable the device to generate a 3D environment model that can be translated to 2D floor plan (e.g., the multi-dimensional model). This environment information may then be integrated with signal strength measurements to generate an analysis of signal strengths in different locations in maps. This may enable generating types of heat maps, such as heat maps showing primary and secondary signal strengths, channel interferences, and/or dominance areas. In some implementations, the multi-dimensional model may include auto-detected objects, such as walls, whose signal attenuation factor can be automatically calculated based on the RF measurements.

As a result, a complete view of a physical and RF environment can be automatically generated based on survey measurements, without a need to first create a floor plan or obtain an existing floor plan. The automatic detection of the physical and RF environments may provide a significant time savings for network planning, optimization, and/or troubleshooting. Additionally, the detection can provide more accurate results by avoiding floor plans that could potentially be outdated.

In some implementations, the device may be used to obtain a picture of an AP installed in the environment. The device can determine the type of AP (e.g., manufacturer and model) from the picture by utilizing image recognition (e.g. machine vision, or an object classifier). In some implementations, the image of the AP installed in the environment could be compared to images of known APs in a data structure (e.g., APs from a plurality of manufacturers, including a plurality of models). Further, the device could detect placement and orientation of the AP installed in the environment which could be compared to a planned design to determine whether the installation is correct.

In some implementations, the device can utilize the sensors to collect a variety of information including images, video streams, distances, angles, and elevations. The information from the sensors can then be used to facilitate capacity planning. For example, the device can utilize the sensors to detect a number of objects in an environment (e.g. desks, chairs, and/or people) and/or a size of the environment (e.g., square footage of a room). The device can then utilize the detections to estimate a number of people, each being a possible user of the network, that might use the particular space in the environment. This may enable the device to plan a target capacity for the network based on the information (e.g., the number of observed desks, chairs, and people, indicating a particular usage of the network).

In some implementations, the device can utilize the sensors to determine a type of environment. For example, based on the detected objects, the device could determine that a room is a break room, meeting room, classroom, office, kitchen, lobby, auditorium, warehouse or other type. This may enable the device to then plan a target capacity for the network based on the type of environment (e.g., one type of environment, such as an auditorium, indicating a greater usage of the network than another type of environment, such as a break room). For example, captured images, a video stream, or other sensor information may be recorded from a survey and used for environment classification and/or troubleshooting. The sensor information may then be used to detect different rooms, e.g., break rooms, meeting rooms, and offices, based on pattern and/or image recognition. This sensor information may then be used for defining requirement areas for automatic network planning and/or classifying the environment for analytical or benchmarking purposes.

Several aspects of the disclosure with reference to the appended drawings are now explained. Whenever the shapes, relative positions and other aspects of the parts described are not explicitly defined, the scope of the invention is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

Figure 1:
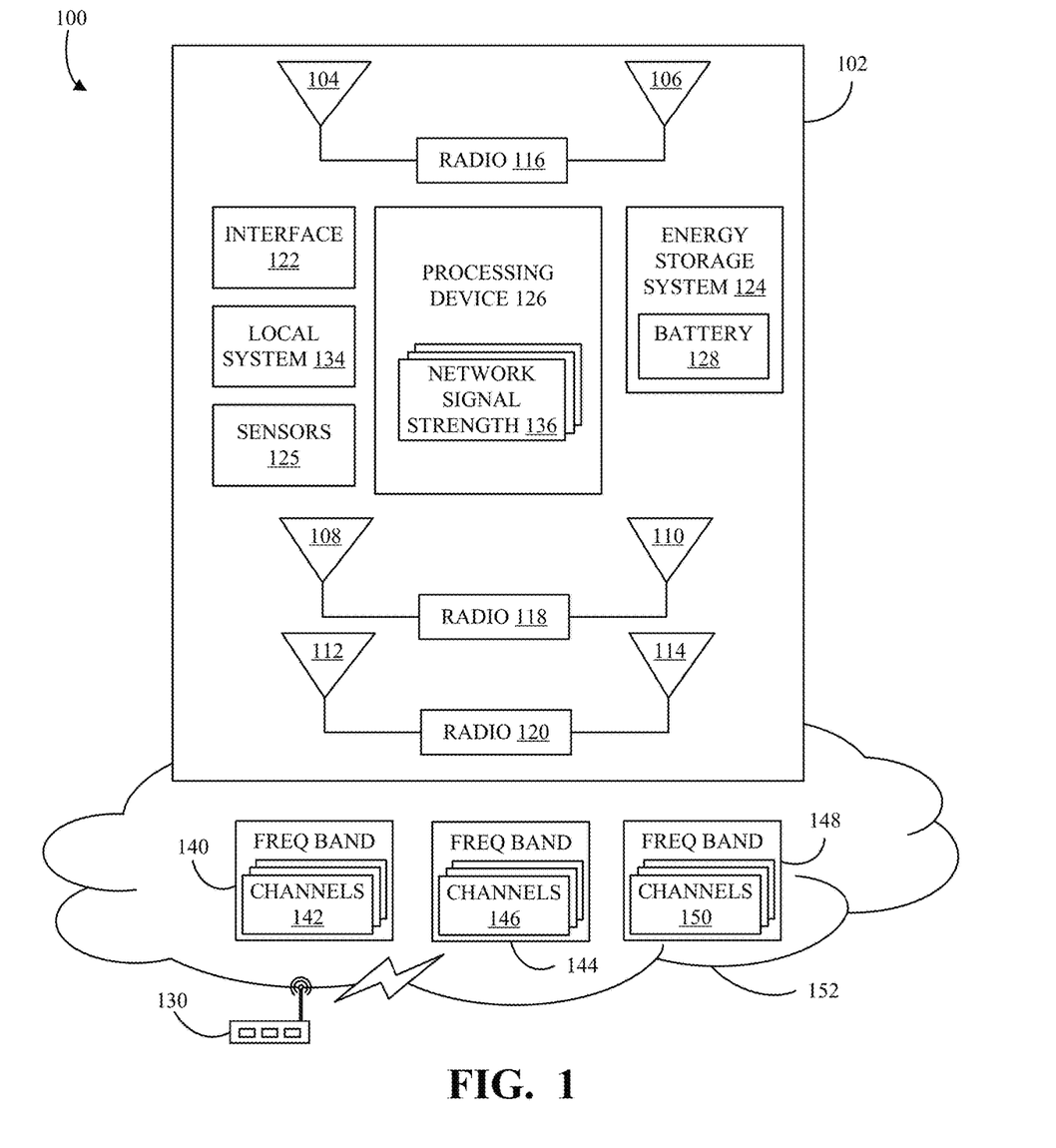
FIG. 1 is a block diagram of an example of a device for generating a multi-dimensional model of a physical environment.

FIG. 1 is a block diagram of an example of a system, e.g., implemented by a device 100, for generating a multi-dimensional model of a physical environment. In some implementations, multiple devices may be used, such as a smartphone, a tablet computer, and/or a dedicated measurement device. The device 100 may perform some or all of the operations or methods described herein. The device 100 may be understood as a network planning tool or as a network measurement device. In some examples, the network measurement device may be a portable measuring device (e.g., a handheld device, or a wearable device, which could be carried by a network surveyor).

The device 100 may include radios 116, 118, and 120, sensors 125, and a processing device 126. Each radio may include one or more antennas such as antennas 104, 106, 108, 110, 112, and 114. Each antenna may generate a respective electric signal containing sensed RF energy in the environment of the device. For example, each antenna may sense communications transmitted by APs, such as an access point 130, over one or more channels. Each antenna may also sense noise, which may be understood as RF energy coming from a non-network source or from a different wireless network.

To generate RF measurements, each of the radios 116, 118, and 120 may be operated to receive an electric signal from its respective one or more antennas and extract information on a particular channel (e.g., at a frequency or frequency range corresponding to the channel). The radio may sense the signal energy (e.g., a signal strength) of that channel. Signal strength may be determined as a measured amplitude of RF energy at a given frequency range corresponding to the channel. In some examples, signal strength may include a ratio such as a signal to noise ratio (SNR) that compares the signal strength of a communication with the amount of noise energy picked up. In some instances, the radio may decode one or more messages over a channel, e.g., by decoding the communication through a known protocol. In some examples, a decoded communication from an AP may be used to determine which channels have activity.

Each of the radios 116, 118, and 120 may include a Wi-Fi receiver (e.g., a Wi-Fi compatible receiver) that can sense signals on one or more Wi-Fi channels over a Wi-Fi network. The receivers may be compatible with WLAN standards 802.11n, 802.11g, 802.11b and 802.11a, to measure information in networks of the corresponding standards. In other embodiments, the receivers may be compatible with another standard.

The sensors 125 may include one or more cameras, LIDAR systems, time of flight (TOF) camera systems (e.g., utilized to measure distances, which could be used in addition to, or in place of, the LIDAR systems), gyroscopes, compasses, and/or accelerometers that enable analyzing a surrounding environment of objects that may affect RF measurements, including walls, windows, doors, floors, ceilings, furniture, machines, people, and other visible structures. The sensors 125 may generate sensor information when sensing in an environment. The sensor information may enable generating a multi-dimensional model of an environment as described herein. In some implementations, the sensor information may be based on input from a combination of sensors (e.g., sensor fusion, where sensor data may be collected from multiple sensors of different types and combined to make determinations as described herein). For example, the sensor information may be based on input from a combination of cameras, LIDAR systems, TOF camera systems, gyroscopes, compasses, and/or accelerometers.

The processing device 126 may include processing logic such as hardware (e.g., an electronic circuit, electronic components, passive components, active components, dedicated logic, programmable logic, a processor, a central processing unit (CPU), memory, a system-on-chip (SoC), etc.), software (e.g., instructions running/executing on a processing device), firmware (e.g., microcode), or a combination thereof. The processing device 126 may be stand-alone within the device 100, or distributed through various other components, or both. For example, each of the radios 116, 118, and 120 may comprise some or all of the processing logic that forms the processing device 126. The processing device 126 may include one or more processors that execute software instructions stored on non-volatile memory to operate the device 100 and its various components as described.

The processing device 126 may be configured to generate a multi-dimensional model of an environment. For example, the processing device 126 may operate the sensors 125 to sense objects (e.g., walls, windows, doors, floors, ceilings, furniture, machines, people, and other visible structures) in an environment. The processing device 126 may then generate the multi-dimensional model of the environment from the sensed information, such as the sensed walls, windows, doors, floors, ceilings furniture, machines, people, and other visible structures. The multi-dimensional model could be a 2D or 3D floor plan of the physical environment.

The processing device 126 may also generate RF measurements based on RF signals detected by the radios 116, 118, and 120. The processing device 126 can utilize the radios 116, 118, and 120 to determine whether a channel of a wireless network has activity. In some cases, the processing device 126 may operate the radios to scan a limited range of default channels to obtain information about which of the channels in the network are active.

A channel of the wireless network 152 may be a pre-defined (e.g., standardized) frequency range of a frequency band. For example, a wireless network may include a first frequency band 140 that is subdivided into dedicated frequency ranges that each represent one of channels 142. The wireless network may include a second frequency band 144 that similarly has a second set of channels 146, and a third frequency band 148 that has a third set of channels 150. Access point 130 may include multiple radios, each dedicated to communicating over one of the frequency bands 140, 144, or 148. An AP with three radios may be referred to as a tri-band access point.

One or more default channels may be scanned to perform out-of-band discovery. The processing device 126 may obtain from the first frequency band 140 (e.g., a 2.4 GHz frequency band) or from the second frequency band 144 (e.g., a 5 GHz frequency band), a list of one or more channels that are active on the third frequency band 148 (e.g., a 6 GHz frequency band). The processing device 126 may listen on a default channel in the first frequency band 140 or the second frequency band 144 to obtain such a list.

In some examples, obtaining the list of the one or more channels includes obtaining a beacon frame from access point 130 over the first frequency band 140 or the second frequency band 144. The beacon frame may include the list of one or more active channels on the third frequency band 148. A beacon frame may be referred to as a management frame and may be standardized in IEEE 802.11 based WLANs. Beacon frames may be transmitted periodically by access point 130 to announce the presence of a wireless LAN and to synchronize the members of the service set. Beacon frames may be transmitted by the AP in an infrastructure basic service set (BSS). Access point 130 may inform a client that probes the first frequency band 140 or the second frequency band 144 about the existence of the third frequency band 148 and provide information as to which of channels 150 in the third frequency band 148 are active. As such, device 100 may actively probe one or more default channels in channels 142 or channels 146 to obtain which of channels 150 are active.

Additionally, or alternatively, processing device 126 may obtain from access point 130 a list of active channels of one or more neighboring APs on the wireless network. Wireless Local Area Network (WLAN) Radio Measurements may include protocols that allow an AP or client to obtain information to better understand the wireless network environment. A device such as the device 100 may obtain such information from access point 130.

In response to a channel having activity, the processing device 126 may operate the one or more radios 116, 118, or 120 to sense a signal strength 136 of the channel. For example, a radio may be operated to process its respective antenna signal to sense communications over a specified channel (e.g., the channel with activity), extract data from that signal, or measure the signal strength of that signal, or both.

In the case where a radio has multiple antennas, the radio may combine the antenna signals, such as by taking the average or the strongest of the antenna signals and using that combined signal for the measurement of the signal strength. The radio may also extract data (e.g., decode the signal) from each antenna. Thus, processing device 126 may sense a plurality of signal strengths 136, each corresponding to an active channel. Processing device 126 may skip or ignore other channels that are not deemed to have activity.

The processing device 126 may operate the one or more radios (e.g., 116, 118, and 120) to sweep each of those channels that have activity and determine the network signal strength at each of the different plurality of frequency ranges. One radio may sense signal strength of one channel (which has been determined to have activity), while another radio simultaneously senses signal strength of another channel (which has been determined to have activity), and so on. In such a manner, the active channels may be measured quickly. The channels that are not determined to have activity may be ignored and skipped.

The device 100 may include a housing or enclosure 102 that houses the various components such as the one or more radios (e.g., radio 116, radio 118, and radio 120), one or more antennas (e.g., antennas 104, 106, 108, 110, 112, 114), the sensors 125, the processing device 126, as well as other components. Each antenna may be fixed on the device 100 with a different position (e.g., with a unique direction and/or location).

In some examples, the device 100 may include an interface 122 which may include a button, a touchscreen display, a microphone, etc., to receive user inputs. Interface 122 may include a wired or wireless port to communicate from the device 100 to an external device. For example, the device 100 may communicate information (e.g., network signal strength and sensor information) gathered by the measuring device or be used to update the settings of the device 100, or otherwise interact with external devices. In some examples, a user may operate the device with a second device (e.g., a computer, a tablet computer, a mobile phone, etc.) that may provide user inputs to control how the processing device 126 is to determine which channels are active.

In some implementations, the device 100 may include a localizer system 134 that may determine a location of the device 100. The localizer system 134 may include Wi-Fi position system (WPS) which utilizes sensor information and/or sensed characteristics (e.g., signal strength) of various APs and known locations of each AP to determine a location of the computing device. Additionally, or alternatively, the localizer system 134 may include global positioning system (GPS) to determine the location of the computing device. The location of the device 100 may be used in association with the sensor information and/or the sensed network signal strength 136 to map out the network signal strength 136 at various locations in a region of interest.

In some implementations, the device 100 is a battery powered device. The device may include an energy storage system 124 which may include one or more batteries 128 that power the various components of the device 100. In some implementations, the batteries may be rechargeable. In some implementations, the batteries are single use. The device 100 may be a cordless device so that a user may carry the device freely throughout a given space, generate the multi-dimensional model and RF measurements, and map the RF measurements to locations in the multi-dimensional model at various locations.

Although not shown, the device 100 may include one or more printed circuit boards and other electronic components connected to the circuit boards. Some of the components may be integral to or distributed throughout other components.

Figure 2:
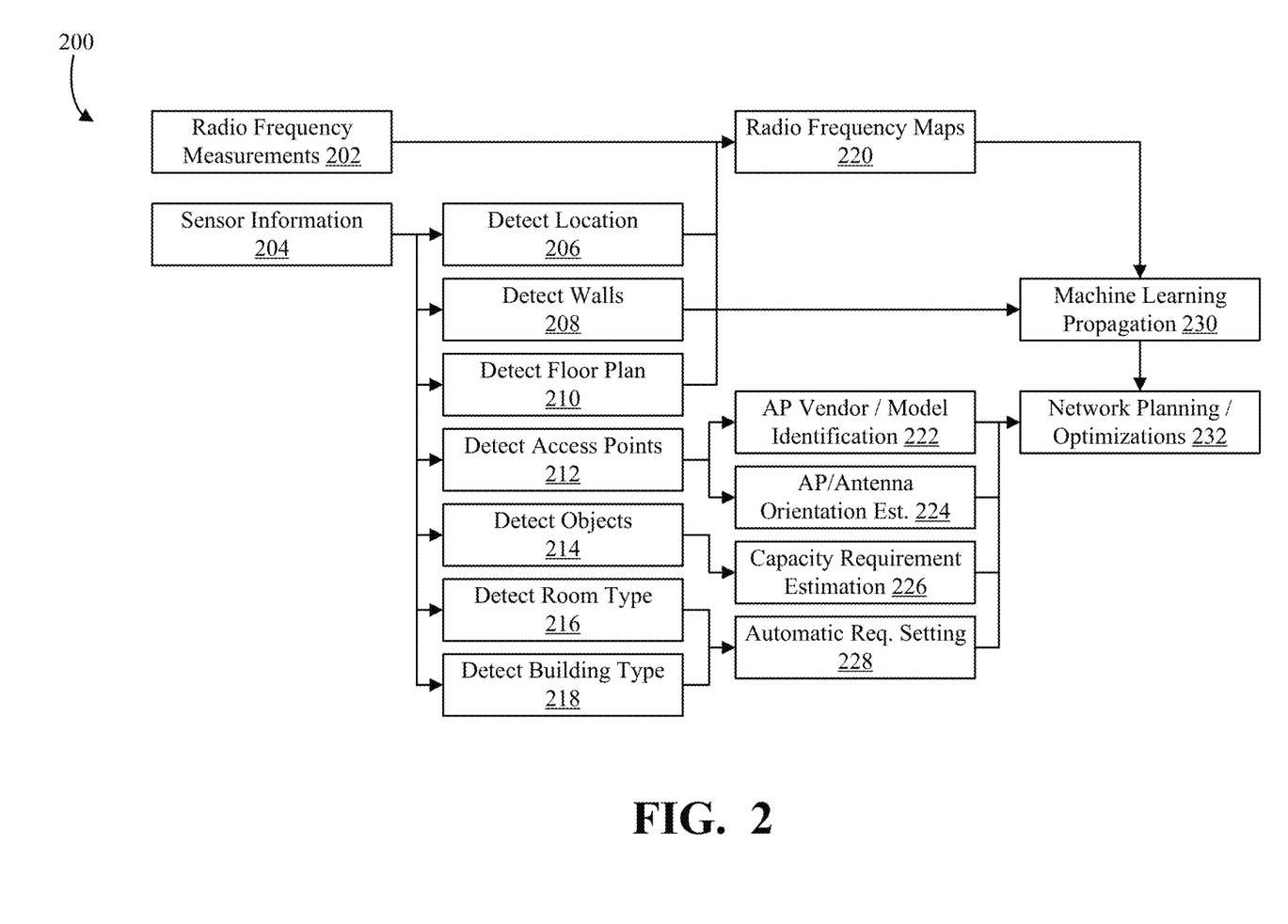
FIG. 2 is a block diagram of an example of operations performed by the device of FIG. 1.

FIG. 2 is a block diagram of an example of operations 200 that may be performed by the device 100. The device 100 can utilize a combination of the sensors 125, the antennas 104, 106, 108, 110, 112, and 114, the radios 116, 118, and 120, and software run by the processing device 126 to generate a multi-dimensional model of a physical environment while obtaining RF measurements in the environment. This may enable surveying a wireless network (e.g., including the access point 130) deployed in an environment without previously obtaining a floor plan of the environment.

The device 100 can detect RF signals in the physical environment using the antennas 104, 106, 108, 110, 112, and 114 and the radios 116, 118, and 120. The device 100 can generate RF measurements 202 based on the RF signals. The device 100 can also obtain sensor information 204 (e.g., camera images, video stream, laser distances, and/or angles) from the sensors 125. The device 100 can generate a multi-dimensional model (e.g., a 2D or 3D floor plan) of the physical environment based on the sensor information 204. For example, the sensor information 204 may be utilized by the device 100 to one or more of detect a location 206 of the device 100; detect walls 208 in the environment; detect a floor plan 210 of the environment; detect access points 212 in the environment; detect other objects 214 in the environment (e.g. desks, chairs, and/or people); detect a room type 216 associated with the environment (e.g., break room, meeting room, classroom, office, kitchen, lobby, auditorium, warehouse or other type); and/or detect a building type 218 associated with the environment (e.g., an office building, school, hospital, house, or other type). The device 100 can then generate RF maps 220 based on mapping the RF measurements 202 to locations in the multi-dimensional model from the location 206, the walls 208, the other objects 214, and/or the floor plan 210.

In some implementations, the device 100 may use a camera (e.g., the sensors 125) to obtain a picture of an AP (e.g., the access point 130) installed in the environment during the surveying. The device 100 can then determine the type of the AP, such as the AP vendor/model identification 222, from the picture by utilizing an image recognition process (e.g. the processing device 126 could perform a machine vision task or run an object classifier). For example, the AP can be compared to images of known APs in a data structure (e.g., from a plurality of manufacturers, including a plurality of models). Further, the device 100 could detect the AP placement and/or antenna orientation 224 (e.g., via triangulation utilizing the RF measurements, and/or image recognition from the sensor information) in the environment and compare that to a planned design to determine whether the installation is correct and/or a change is determined.

In some implementations, the device 100 can utilize the sensor information to estimate a capacity requirement 226 of the environment (e.g., facilitate capacity planning). For example, based on detecting the other objects 214 (e.g. six chairs), the device 100 can estimate a minimum bandwidth for that location in the environment (e.g., that six or more people might access the network as users in that particular space). For example, the device 100 might plan a target capacity for the network based on the sensor information.

In some implementations, the device 100 can utilize the sensor information to plan a target capacity for the network and/or to determine network settings 228 for the network. For example, based on detecting the room type 216 (e.g., a conference room) and/or the building type 218 (e.g., an office building), the device 100 can estimate a minimum bandwidth for the room and/or building (e.g., six people might access the network as users at the same time with a particular bit speed). This may enable the device 100 to plan the target capacity for the network, and configuration of the network, based on the type of environment.

In some implementations, the device 100 can utilize the RF measurements 202 and the sensor information for machine learning. For example, based on the RF maps 220, the location 206, the walls 208, the other objects 214, and/or the floor plan 210, the device 100 can generate information for machine learning propagation 230. The machine learning propagation 230 may enable learning, for example, RF measurements and/or obstacles in the environment (e.g., how an obstacle affects an RF measurement).

As a result, a network surveyor could simply walk in the physical environment with the device 100 and map measurements to locations by generating a multi-dimensional model comprising the floor plan. Further, the device 100 may enable network planning and/or optimizations 232 based on the RF measurements and the sensor information. For example, the network planning and/or optimizations 232 may include a plan for a new network, or a change to an existing network that is generating the RF signals, such as a change to the access point. The network planning and/or optimizations 232 may be determined based on the RF maps 220, the location 206, the walls 208, the other objects 214, the floor plan 210, the AP vendor/model identification 222, the AP placement and/or antenna orientation 224, the capacity requirement 226, the network settings 228, and/or the machine learning propagation 230.

Figure 3:
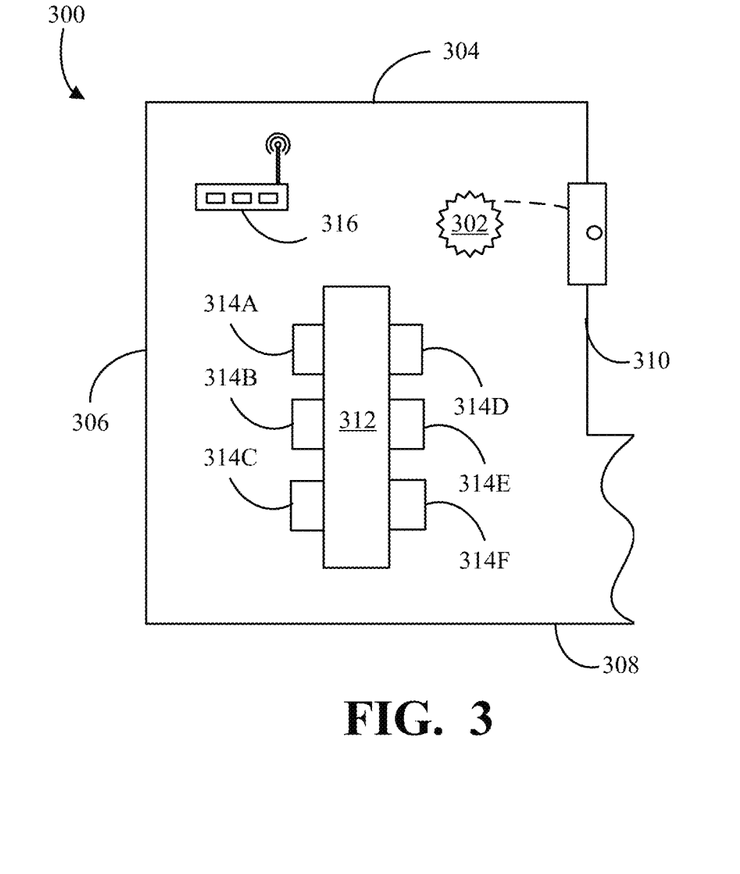
FIG. 3 is an example of a multi-dimensional model including a first portion of a physical environment.
Figure 4:
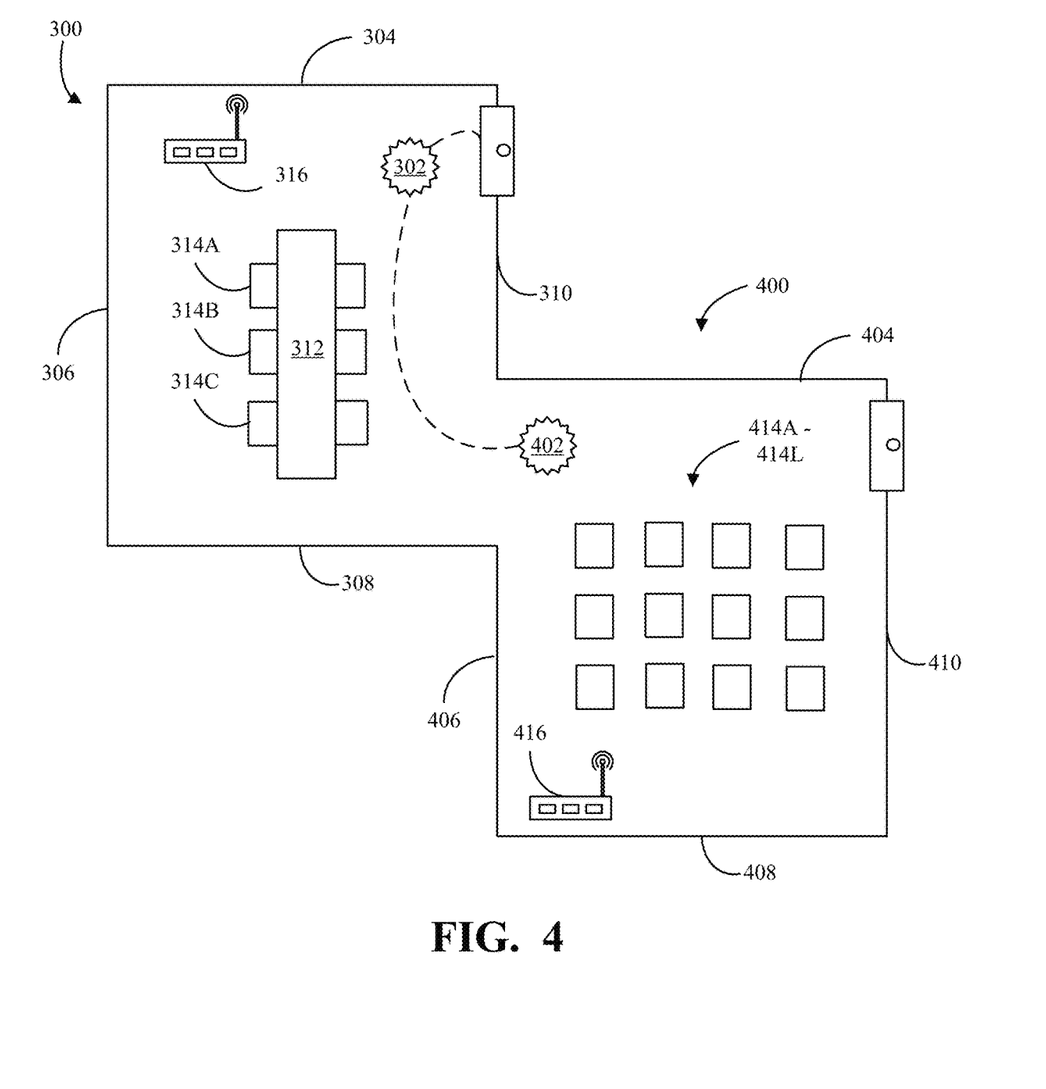
FIG. 4 is an example of a multi-dimensional model updated to include a second portion of a physical environment.

FIGS. 3 and 4 illustrate an example of generating a multi-dimensional model including multiple rooms in a physical environment. Referring to FIG. 3, the device 100 could be brought into a first portion 300 of the physical environment, which could initially be an unknown room in an unknown structure. For example, a network surveyor could carry the device 100 through a doorway into the first portion 300. At a first measurement point 302, the device 100 may be triggered (e.g., a button pressed by the network surveyor) to detect RF signals using the antennas 104, 106, 108, 110, 112 and the radios 116, 118, and 120, and to generate RF measurements (e.g., RF measurements 202) based on the RF signals. Further, based on the triggering, the device 100 may generate a multi-dimensional model of the environment that includes the first portion 300 based on sensor information from the sensors 125 (e.g., the sensor information 204). The multi-dimensional model may include, for example, detection of walls 304, 306, 308, and 310 defining a first room having a first square footage, detection of a table 312 in the first room, and detection of chairs 314A to 314F around the table 312. The detections may be based on a combination of sensing from the sensors 125, such as imaging from cameras, measurements from gyroscopes, compasses, and/or accelerometers, and/or distances from LIDAR systems and/or TOF camera systems (e.g., sensor fusion), of the device 100 from the first measurement point 302. Further, the device 100 may detect an access point 316 in a northwest corner of the first room and may include the access point 316 in the multi-dimensional model. Each of the detections (e.g., the walls 304, 306, 308, and 310, the table 312, the chairs 314A to 314F, and the access point 316) may be detected at Cartesian X-Y coordinates that are captured relative to the first measurement point 302.

The device 100 can then map the RF measurements to a location of the first measurement point 302 in the multi-dimensional model (e.g., a first map of the RF maps 220). The device 100 might determine that the first room is a conference room based on the sensed information (e.g., detection of chairs 314A to 314F around the table 312). Further, the device 100 can determine, for the access point 316, a first AP vendor/model identification (e.g., the AP vendor/model identification 222) and/or a first AP placement and/or antenna orientation (e.g., the AP placement and/or antenna orientation 224).

Referring to FIG. 4, the device 100 could then be brought into a second portion 400 of the physical environment, which could be a next unknown room. For example, the network surveyor could carry the device 100 through a hallway into the second portion 400. At a second measurement point 402, the device 100 may be triggered a second time (e.g., the button pressed again by the network surveyor) to again detect RF signals using the antennas 104, 106, 108, 110, 112 and the radios 116, 118, and 120, and generate RF measurements (e.g., RF measurements 202) based on the RF signals. Further, based on the second triggering, the device 100 may update the multi-dimensional model of the environment to include the second portion 400 based on an update of the sensor information from the sensors 125 (e.g., sensor information 204). For example, the multi-dimensional model may add detection of walls 404, 406, 408, and 410 defining a second room having a second square footage, and detection of chairs 414A to 414L facing wall 408. The detections may be based on a combination of sensing from the sensors 125, such as imaging from cameras, measurements from gyroscopes, compasses, and/or accelerometers, and/or distances from LIDAR systems and/or TOF camera systems (e.g., sensor fusion), of the device 100 from the second measurement point 402. Further, the device 100 may detect a second access point 416 in a southwest corner of the second room and may include the second access point 416 in the multi-dimensional model. Each of the new detections (e.g., the walls 404, 406, 408, and 410, the chairs 414A to 414L, and the access point 416) may be detected at Cartesian X-Y coordinates that are captured relative to the second measurement point 402.

The device 100 can then map the RF measurements to a location of the second measurement point 402 in the multi-dimensional model (e.g., a second map of the RF maps 220). The device 100 might determine that the second room is an auditorium based on the sensed information (e.g., detection of chairs 414A to 414L facing wall 408). Further, the device 100 can determine, for the access point 416, a second AP vendor/model identification (e.g., the AP vendor/model identification 222) and/or a second AP placement and/or antenna orientation (e.g., the AP placement and/or antenna orientation 224).

As a result, a complete view of a physical and RF environment can be automatically generated from the survey measurements (e.g., the first measurement point 302 and the second measurement point 402) without a need to first create a floor plan or obtain an existing floor plan. This automatic detection of the physical and RF environments may provide a significant time savings for network planning, optimization, and/or troubleshooting.

In some implementations, the device 100 can utilize the sensor information to estimate a capacity requirement (e.g., the capacity requirement 226). For example, based on detecting the chairs 314A to 314F around the table 312 in the first room, the device 100 can estimate a first minimum bandwidth for the first room. Additionally, based on detecting the chairs 414A to 414L facing the wall 408, the device 100 can estimate a second minimum bandwidth for the second room. As additional rooms are sensed, the device 100 may identify the rooms with greater accuracy. This may enable the device 100 to plan the target capacity for the network, and configuration of the network, based on the type of environment.

Figure 5:
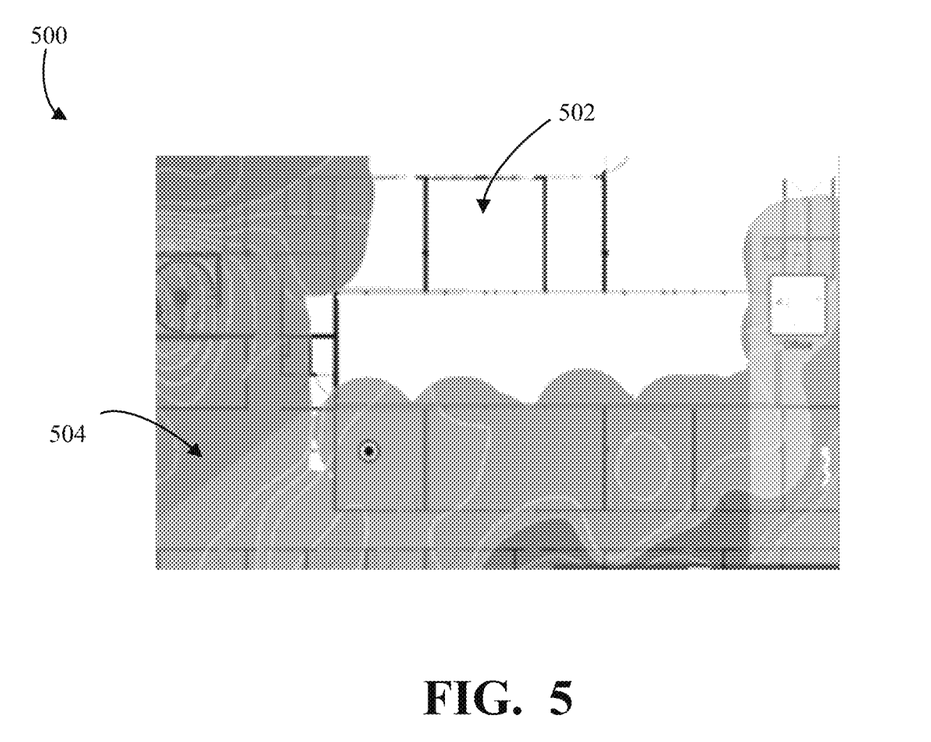
FIG. 5 is an example of a GUI configured to display a multi-dimensional model and mapping of RF measurements.

In some implementations, the device 100 can configure a GUI to display the multi-dimensional model and the mapping. FIG. 5 is an example of GUI 500 that could be displayed by a computer, such as the device 100. The GUI 500 may be generated based on survey measurements in an environment (e.g., the first measurement point 302 and the second measurement point 402). The GUI 500 may include a floor plan 502, generated from the sensor information, and RF measurements 504 generated from the RF signals. The RF measurements may include ranges of different signal strengths (e.g., denoted by variations in color) extending to different portions of the floor plan 502 (e.g., denoted by variations in shapes having the color). The GUI 500 could represent a heat map for determining a change to a network (e.g., the RF maps 220). The GUI 500 could enable network planning and/or optimizations of the environment (e.g., the network planning and/or optimizations 232).

Figure 6:
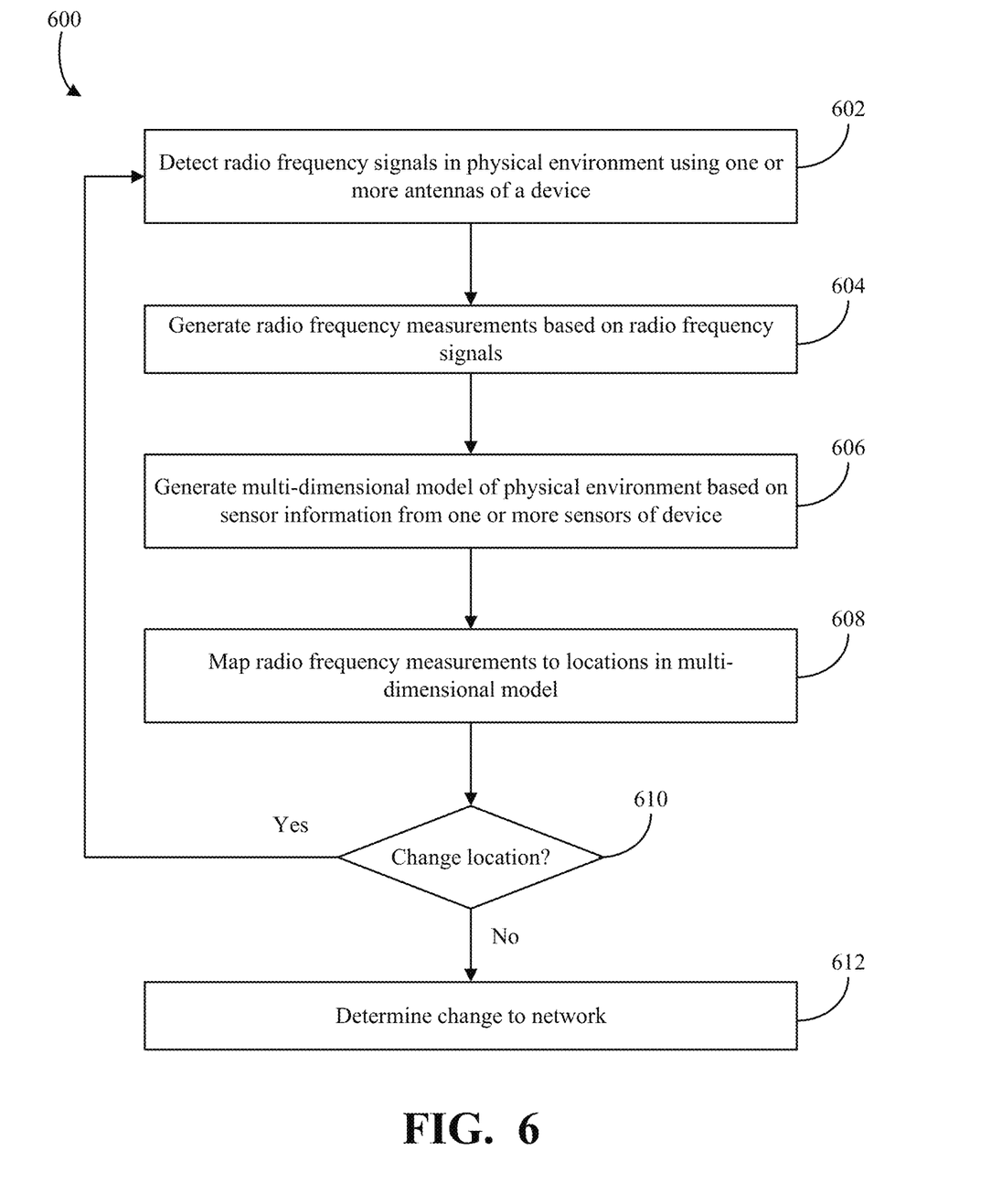
FIG. 6 is a flowchart of an example of a process for generating a multi-dimensional model of a physical environment for mapping RF measurements.

FIG. 6 is a flowchart of an example of a process 600 for generating a multi-dimensional model of a physical environment for mapping RF measurements. The process 600 can be executed using computing devices, such as the systems, hardware, and software described with respect to FIGS. 1-5. The process 600 can be performed, for example, by executing a machine-readable program or other computer-executable instructions, such as routines, instructions, programs, or other code. The operations of the process 600 or another technique, method, process, or algorithm described in connection with the implementations disclosed herein can be implemented directly in hardware, firmware, software executed by hardware, circuitry, or a combination thereof.

For simplicity of explanation, the process 600 is depicted and described herein as a series of operations. However, the operations in accordance with this disclosure can occur in various orders and/or concurrently. Additionally, other operations not presented and described herein may be used. Furthermore, not all illustrated operations may be required to implement a technique in accordance with the disclosed subject matter.

At operation 602, one or more devices may detect RF signals in a physical environment using one or more antennas of the device. For example, the device 100 may utilize the antennas 104, 106, 108, 110, 112 and the radios 116, 118, and 120 to detect RF signals in the environment. The device 100 could be carried and operated by a network surveyor.

At operation 604, the device may generate RF measurements based on the RF signals. For example, the processing device 126 of the device 100 may generate RF measurements based on the RF signals that detected. In some implementations, the radios 116, 118, and 120 may sense signal energy (e.g., signal strengths) of channels. Signal strengths may be determined as a measured amplitude of RF energy at a given frequency range corresponding to the channel. In some examples, signal strength may include a ratio such as an SNR that compares the signal strength of a communication with the amount of noise energy picked up.

At operation 606, the device may generate a multi-dimensional model of the physical environment based on sensor information from one or more sensors of the device. For example, the processing device 126 may operate the sensors 125 to sense walls, windows, doors, floors, ceilings, furniture, machines, people, and other visible structures in an environment. The processing device 126 may then generate the multi-dimensional model of the environment from sensed information, such as the sensed walls, windows, doors, floors, ceilings, furniture, machines, people, and other visible structures. The multi-dimensional model could be a 2D or 3D floor plan of the physical environment.

At operation 608, the device may map the RF measurements to locations in the multi-dimensional model. The locations may be mapped based on Cartesian coordinates that are relative to measurement points.

At operation 610, the device may determine whether there is a change in location of the device. For example, the device could be carried to a next measurement point in a next room. If there is a change in location of the device ("Yes"), the device can manually or automatically return to operation 602 to detect next RF signals, to operation 604 to generate next RF measurements, to operation 606 to update the multi-dimensional model, and to operation 608 to map the next RF measurements to locations in the update of the multi-dimensional model. However, if there is not a change in location of the device ("No"), at operation 612, the device can determine recommendations, such as a change to the network that is generating the RF signals. The change may be based on the objects that are detected and/or the type of room or the type of building that is detected. In some implementations, the change could be to a configuration of an AP based, such as placement of the AP and/or orientation of antennas of the AP. In some implementations, the device can configure a GUI to display the multi-dimensional model and the mapping.

Some implementations may include a method including detecting RF signals in a physical environment using one or more antennas of a device; generating RF measurements based on the RF signals; generating a multi-dimensional model of the physical environment based on sensor information from one or more sensors of the device; and mapping the RF measurements to locations in the multi-dimensional model. In some implementations, the method may include configuring a GUI to display the multi-dimensional model and the mapping. In some implementations, the multi-dimensional model is a 2D or 3D floor plan of the physical environment. In some implementations, generating the multi-dimensional model includes utilizing a combination of sensing from the one or more sensors to detect a plurality of walls and a plurality of objects in the physical environment. In some implementations, the multi-dimensional model and the RF measurements are updated based on a change in location of the device. In some implementations, the method may include detecting a plurality of objects in the multi-dimensional model; and determining a change to a network that is generating the RF signals based on the plurality of objects. In some implementations, the method may include identifying a type of room or building in the multi-dimensional model; and determining a change to a network that is generating the RF signals based on the type of room or building. In some implementations, the method may include estimating a number of users in the physical environment; and determining a change to a network that is generating the RF signals based on the number of users. In some implementations, the method may include detecting a location of an access point in the multi-dimensional model; and determining a change to the access point based on the RF measurements mapped to locations in the multi-dimensional model. In some implementations, the method may include determining a type of access point in the multi-dimensional model; and determining a change to the access point based on the RF measurements mapped to locations in the multi-dimensional model. In some implementations, the one or more sensors include a plurality of cameras. In some implementations, the one or more sensors include a light detection and ranging (LIDAR) system. In some implementations, the sensor information is based on input from a combination sensors. In some implementations, the combination of sensors includes at least two of: a LIDAR system, a TOF camera system, a gyroscope, a compass, or an accelerometer.

Some implementations may include a system, comprising: a plurality of antennas; a plurality of sensors; and one or more processors configured to execute instructions stored in memory to: detect RF signals in a physical environment using the plurality of antennas; generate RF measurements based on the RF signals; generate a multi-dimensional model of the physical environment based on sensor information from the plurality of sensors; and map the RF measurements to locations in the multi-dimensional model. In some implementations, generating the multi-dimensional model includes utilizing a combination of sensing from the plurality of sensors to detect a plurality of walls and a plurality of objects in the physical environment. In some implementations, the one or more processor are further configured to execute instructions stored in the memory to update the multi-dimensional model and the RF measurements based on a change in location of the system. In some implementations, the one or more processor are further configured to execute instructions stored in the memory to: configure a GUI to display the multi-dimensional model and the mapping to a user interface of the system. In some implementations, the plurality of sensors includes a camera and a gyroscope.

Some implementations may include a non-transitory computer readable medium storing instructions operable to cause one or more processors to perform operations comprising: detecting RF signals in a physical environment using one or more antennas of a device; generating RF measurements based on the RF signals; generating a multi-dimensional model of the physical environment based on sensor information from one or more sensors of the device; and mapping the RF measurements to locations in the multi-dimensional model. In some implementations, the operations further comprise updating the multi-dimensional model and the RF measurements based on a change in location of the device. In some implementations, the operations further comprise detecting a plurality of objects in the multi-dimensional model; and determining a change to a network that is generating the RF signals based on the plurality of objects. In some implementations, the operations further comprise detecting a location of an access point in the multi-dimensional model; and determining a change to the access point based on the RF measurements mapped to locations in the multi-dimensional model.

In utilizing the various aspects of the embodiments, it would become apparent to one skilled in the art that combinations or variations of the above embodiments are possible for generating a multi-dimensional model of a physical environment for mapping radio frequency measurements associated with a wireless network. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method, comprising:
   detecting radio frequency (RF) signals in a physical environment using one or more antennas of a device;
   generating RF measurements based on the RF signals;
   generating a multi-dimensional model comprising a floor plan of the physical environment based on sensor information from one or more sensors of the device;
   mapping the RF measurements to locations in the multi-dimensional model;
   estimating a number of users in the physical environment; and
   determining whether to make a change to a network that is generating the RF signals based on the RF measurements mapped to locations in the multi-dimensional model that is sensed and the number of users.

2. The method of claim 1, further comprising:
   configuring a graphical user interface (GUI) to display the multi-dimensional model and the mapping.

3. The method of claim 1, wherein the multi-dimensional model is a 2D or 3D floor plan of the physical environment.

4. The method of claim 1, wherein generating the multi-dimensional model includes utilizing a combination of sensing from the one or more sensors to detect a plurality of objects in the physical environment.

5. The method of claim 1, wherein the multi-dimensional model and the RF measurements are updated based on a change in location of the device.

6. The method of claim 1, further comprising:
   detecting a plurality of objects in the multi-dimensional model; and
   determining a change to a network that is generating the RF signals based on the plurality of objects.

7. The method of claim 1, further comprising:
   identifying a type of room or building in the multi-dimensional model; and
   determining a change to a network that is generating the RF signals based on the type of room or building.

8. The method of claim 1, further comprising:
   determining a type of access point in the multi-dimensional model; and
   determining a change to the access point based on the RF measurements mapped to locations in the multi-dimensional model.

9. The method of claim 1, wherein the sensor information is based on input from a combination of sensors.

10. The method of claim 9, wherein the combination of sensors includes at least two of: a light detection and ranging (LIDAR) system, a time of flight (TOF) camera system, a gyroscope, a compass, or an accelerometer.

11. The method of claim 1, further comprising:
    displaying a heat map for determining the change to the network.

12. A system, comprising:
    a plurality of antennas;
    a plurality of sensors; and
    one or more processors configured to execute instructions stored in memory to:

detect radio frequency (RF) signals in a physical environment using the plurality of antennas;
generate RF measurements based on the RF signals;
generate a multi-dimensional model comprising a floor plan of the physical environment based on sensor information from the plurality of sensors;
map the RF measurements to locations in the multi-dimensional model;
identify a type of room or building in the multi-dimensional model; and
determine whether to make a change to a network that is generating the RF signals based on the RF measurements mapped to locations in the multi-dimensional model that is sensed and the type of room or building.

13. The system of claim 12, wherein generating the multi-dimensional model includes utilizing combination of sensing from the plurality of sensors to detect a plurality of objects in the physical environment.

14. The system of claim 12, wherein the one or more processor are further configured to execute instructions stored in the memory to:
update the multi-dimensional model and the RF measurements based on a change in location of the system.

15. The system of claim 12, wherein the one or more processor are further configured to execute instructions stored in the memory to:
configure a graphical user interface (GUI) to display the multi-dimensional model and the mapping to a user interface of the system.

16. The system of claim 12, wherein the plurality of sensors includes a combination of sensors at least two of: a camera, a light detection and ranging (LIDAR) system, a time of flight (TOF) camera system, a compass, an accelerometer, or a gyroscope.

17. A non-transitory computer readable medium storing instructions operable to cause one or more processors to perform operations comprising:
detecting radio frequency (RF) signals in a physical environment using one or more antennas of a device;
generating RF measurements based on the RF signals;
generating a multi-dimensional model comprising a floor plan of the physical environment based on sensor information from one or more sensors of the device;
mapping the RF measurements to locations in the multi-dimensional model;
determine a type of access point in the multi-dimensional model; and
determine whether to make a change to the access point based on the RF measurements mapped to locations in the multi-dimensional model that is sensed and the type of access point.

18. The non-transitory computer readable medium storing instructions of claim 17, wherein the operations further comprise:
updating the multi-dimensional model and the RF measurements based on a change in location of the device.

19. The non-transitory computer readable medium storing instructions of claim 17, wherein the operations further comprise:
detecting a plurality of objects in the multi-dimensional model; and
determining a change to a network that is generating the RF signals based on the plurality of objects.

20. The non-transitory computer readable medium storing instructions of claim 17, wherein the operations further comprise:
detecting a location of an access point in the multi-dimensional model; and
determining a change to the access point based on the RF measurements mapped to locations in the multi-dimensional model.

* * * * *